US012799951B2

(12) United States Patent
Turgeon et al.

(10) Patent No.: US 12,799,951 B2
(45) Date of Patent: Nov. 17, 2026

(54) REPLACEABLE FAN MODULE FOR ELECTRICAL DEVICE

(71) Applicant: Cisco Technology, Inc., San Jose, CA (US)

(72) Inventors: Guillaume Turgeon, Laval (CA); Nicolas Côté, L'Ile Bizard (CA)

(73) Assignee: CISCO TECHNOLOGY, INC., San Jose, CA (US)

( * ) Notice: Subject to any disclaimer, the term of this patent is extended or adjusted under 35 U.S.C. 154(b) by 218 days.

(21) Appl. No.: 18/609,335

(22) Filed: Mar. 19, 2024

(65) Prior Publication Data

US 2025/0297619 A1 Sep. 25, 2025

(51) Int. Cl.
*F04D 29/64* (2006.01)
*F04D 19/00* (2006.01)
*F04D 29/52* (2006.01)
*H05K 7/20* (2006.01)

(52) U.S. Cl.
CPC ......... *F04D 29/646* (2013.01); *F04D 19/002* (2013.01); *F04D 29/522* (2013.01); *H05K 7/20172* (2013.01); *H05K 7/20727* (2013.01)

(58) Field of Classification Search
CPC .... F04D 29/646; F04D 19/002; F04D 29/522; H05K 7/20172; H05K 7/20727
See application file for complete search history.

(56) References Cited

U.S. PATENT DOCUMENTS 6,808,411 B2 * 10/2004 Chen .................. H05K 7/20172 439/246
7,515,413 B1 4/2009 Curtis
8,517,678 B2 * 8/2013 Li ............................ G06F 1/20 415/213.1
10,372,178 B2 8/2019 Chang et al.
2008/0239665 A1 * 10/2008 Franz .................... F04D 29/664 417/423.15
2012/0219427 A1 8/2012 Mao et al.
2015/0208548 A1 7/2015 Chu et al.
2016/0053776 A1 2/2016 Williams
2017/0086332 A1 3/2017 Jaskela et al.
2020/0008318 A1 1/2020 Lu
2022/0225543 A1 * 7/2022 Lo ...................... H05K 7/20727
2023/0232571 A1 7/2023 Jagadeesan et al.
2023/0301031 A1 * 9/2023 Geng ....................... H05K 1/09

OTHER PUBLICATIONS

FS: "Hot-swappable Fan Module, Front-to-Back Airflow through the S5850-32S2Q Switch Chassis", Mar. 15, 2022, retrieved from https://www.fs.com/products/70290.html, 5 Pages.
Networktigers: "Cisco C3850-FAN-T1 Catalyst 3850 Series 1x Fan Switch Fan Module", Mar. 4, 2020, retrieved from https://www.networktigers.com/products/c3850-fan-t1-cisco-fan-module, 9 Pages.

* cited by examiner

*Primary Examiner* — Jacob R Crum
(74) *Attorney, Agent, or Firm* — Edell, Shapiro & Finnan, LLC

(57) ABSTRACT

A fan module that includes a fan housing and a fan. The fan housing includes a first panel, a second panel, and a wall extending from the first panel to the second panel to define a space that extends along the wall, the first panel, and the second panel from a first end of the wall to a second end, opposite the first end, of the wall. The fan is configured to be disposed in the space, and a fastener is configured to extend through the housing, the fan, and an electrical device to couple the fan housing, the fan, and the electrical device to one another.

20 Claims, 10 Drawing Sheets

REPLACEABLE FAN MODULE FOR ELECTRICAL DEVICE

TECHNICAL FIELD

The present disclosure relates to a fan module.

BACKGROUND

A fan module provides cooling to an electrical device, component, and/or system, such as a server rack. For example, the fan module may direct an air flow through an enclosure of the electrical device to cool the electrical device via convection. The cooling of the electrical device by the fan module may reduce or limit a temperature increase of the electrical device to maintain a structural integrity and prolong the useful lifespan of the electrical device. It may be desirable to maintain operation of the electrical device, such as while the fan module is decoupled from the enclosure for inspection, repair, and/or replacement. For example, downtime of the electrical device in which operation is suspended may reduce an operational efficiency of the electrical device. Thus, continued operation of the electrical device while the fan module is decoupled from the enclosure may increase the operational efficiency of the electrical device.

DETAILED DESCRIPTION

Overview

Figure 1:
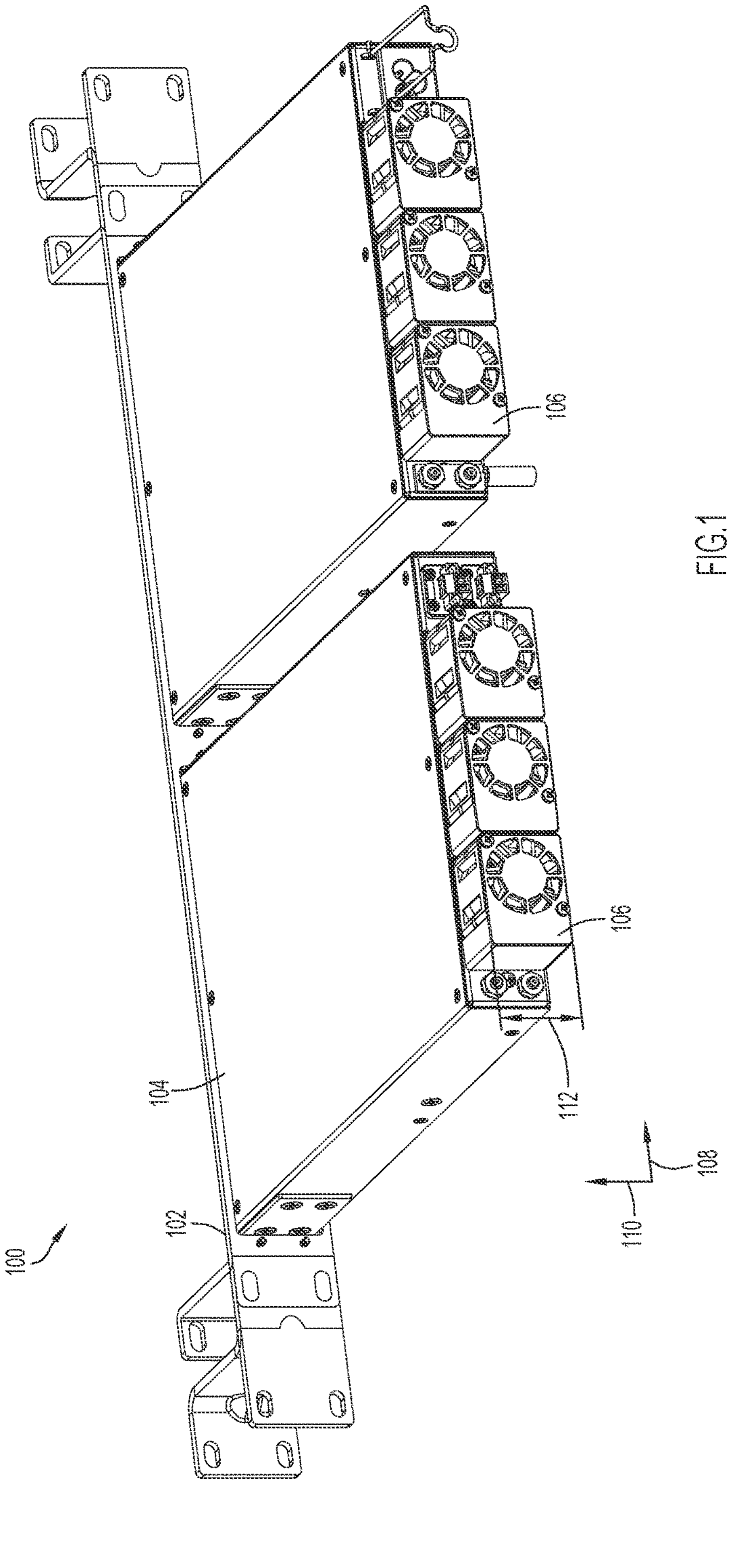
FIG. 1 is a rear perspective view of electrical devices that are each coupled to multiple fan modules, according to an example embodiment.

The present disclosure is directed to a fan module. In some aspects, the techniques described herein relate to an apparatus including: a first panel; a second panel offset from the first panel to define a space therebetween; a wall extending from the first panel to the second panel, such that the space extends along the wall, the first panel, and the second panel from a first end of the wall to a second end, opposite the first end, of the wall; and a fan configured to be disposed in the space between the first panel and the second panel.

In other aspects, the techniques described herein relate to a system including: an electrical device comprising an enclosure, wherein the enclosure defines an interior, and the enclosure comprises an external surface facing away from the interior; and a fan module having: a housing defining a space; a fan positioned in the space of the housing and configured to direct air through the enclosure of the electrical device; and a fastener configured to extend through the housing, the fan, and the external surface of the enclosure to mount the fan module onto the electrical device.

In further aspects, the techniques described herein relate to an apparatus including: a housing comprising a first panel and a second panel cooperatively defining a space therebetween, wherein the first panel comprises a pin extending into the space; a fan configured to be positioned within the space of the housing, wherein the fan comprises a first aperture and a second aperture, and the first aperture is configured to receive the pin of the first panel; and a fastener configured to extend through the second aperture of the fan to couple the fan and the housing to one another.

Example Embodiments

Embodiments of the present disclosure are directed to a fan module configured to couple to and provide cooling to an electrical device. The fan module may include a fan configured to direct (e.g., force, draw) air through an interior of an enclosure of the electrical device while the fan module is coupled to the enclosure. To this end, the fan module may include a housing configured to abut the enclosure to align the fan with an opening of the enclosure to enable the fan to direct air through the opening and the interior of the enclosure. However, the housing may remain exterior of the enclosure to reduce a space occupied by the fan module within the interior of the enclosure. As such, the space in the enclosure may be better utilized (e.g., by enabling an increased amount of space in the fan module for positioning other electrical components), and the fan module may be accessed without having to modify an operation of the electrical device, such as to suspend operation and/or further modify the configuration of the enclosure.

The housing may include two panels that are offset from one another and coupled to one another via a wall. As such, the panels and wall may cooperatively form a space configured to receive the fan. The space may extend, for example, between the first panel and the second panel and along the wall, the first panel, and the second panel from a first end of the wall to a second end, opposite the first end, of the wall. For instance, the wall may extend along a side of the panels to cover the space at the side, and the space may be exposed at remaining sides of the panels. Thus, the space may be more accessible for inserting the fan therein. In some embodiments, each of the panels may include a pin extending into the space, and the fan may include apertures configured to receive the pins to couple the fan to the housing. Additionally, fasteners may be configured to extend through the pins of the panel, the apertures of the fan, and the enclosure of the electrical device to further secure the housing and the fan to one another, as well as to secure the housing to the electrical device. In this manner, the fan module may be readily couplable to and decouplable from the enclosure electrical device via the fasteners. Similarly, the fan and the housing may be couplable to and decouplable from one another via the fasteners. As such, an case of modification of the fan module (e.g., with respect to the electrical device, with respect to individual components of the fan module) may be improved by using the same fasteners to couple each of the fan, the housing, and the electrical device to one another.

With reference made to FIG. 1, depicted therein is a system 100 (e.g., a server rack) that includes a bracket 102, electrical devices 104 (e.g., server devices) coupled to the bracket 102, and fan modules 106 coupled to the electrical devices 104. In the illustrated embodiment, multiple fan modules 106 are coupled to each electrical device 104 and are positioned adjacent to one another along a first axis 108 (e.g., a horizontal axis). Such an arrangement of the fan modules 106 may limit a space occupied by the fan modules 106 along a second axis 110 (e.g., a vertical axis), perpendicular to the first axis 108. For instance, the configuration of the fan modules 106 may enable multiple fan modules 106 to be coupled to each electrical device 104 to provide increased cooling thereof without substantially increasing a physical footprint occupied by the fan modules 106. As an example, a dimension 112 (e.g., a height) of the fan modules 106 may be between 30 millimeters (mm) and 40 mm (e.g., 36 mm) to avoid extending beyond the electrical device 104 and beyond the bracket 102 along the second axis 110. Thus, a space occupied by the system 100 may be more efficiently utilized. For instance, a size (e.g., height) of the electrical devices 104 may be limited to avoid extending beyond the bracket 102 along the second axis 110, and a size of the fan modules 106 may also be limited to avoid extending beyond the electrical device 104 along the second axis 110. As such, each of the electrical devices 104 and fan modules 106 may be contained within the boundary of the bracket 102 (e.g., a particularly sized bracket 102 with limited extension along the second axis 110 and increased extension along the first axis 108). Although three fan modules 106 are coupled to each electrical device 104 in the illustrated system 100, in additional or alternative embodiments, any suitable quantity of fan modules 106 may be coupled to each electrical device 104.

In some embodiments, each fan module 106 may primarily be positioned exterior to the electrical devices 104. In other words, a limited amount of the fan modules 106 may extend into the electrical devices 104. As such, there may be a greater amount of space within the electrical devices 104 for positioning other components, such as other electrical components. Positioning each fan module 106 exterior of the electrical devices 104 may also increase accessibility of the fan modules 106. For instance, the fan modules 106 may be accessed without having to modify a certain configuration of the electrical devices 104. Further still, as discussed herein, the fan modules 106 may be readily couplable to and decouplable from the electrical devices 104. That is, the coupling between the electrical devices 104 and the fan modules 106 may be readily adjusted while the electrical devices 104 are in operation. As such, the fan modules 106 may be hot swappable to prevent or at least reduce a downtime of the electrical devices 104 while enabling the fan modules 106 to be inspected, repaired, and/or replaced. Thus, an operational efficiency of the electrical devices 104 may be increased or maintained.

Figure 2:
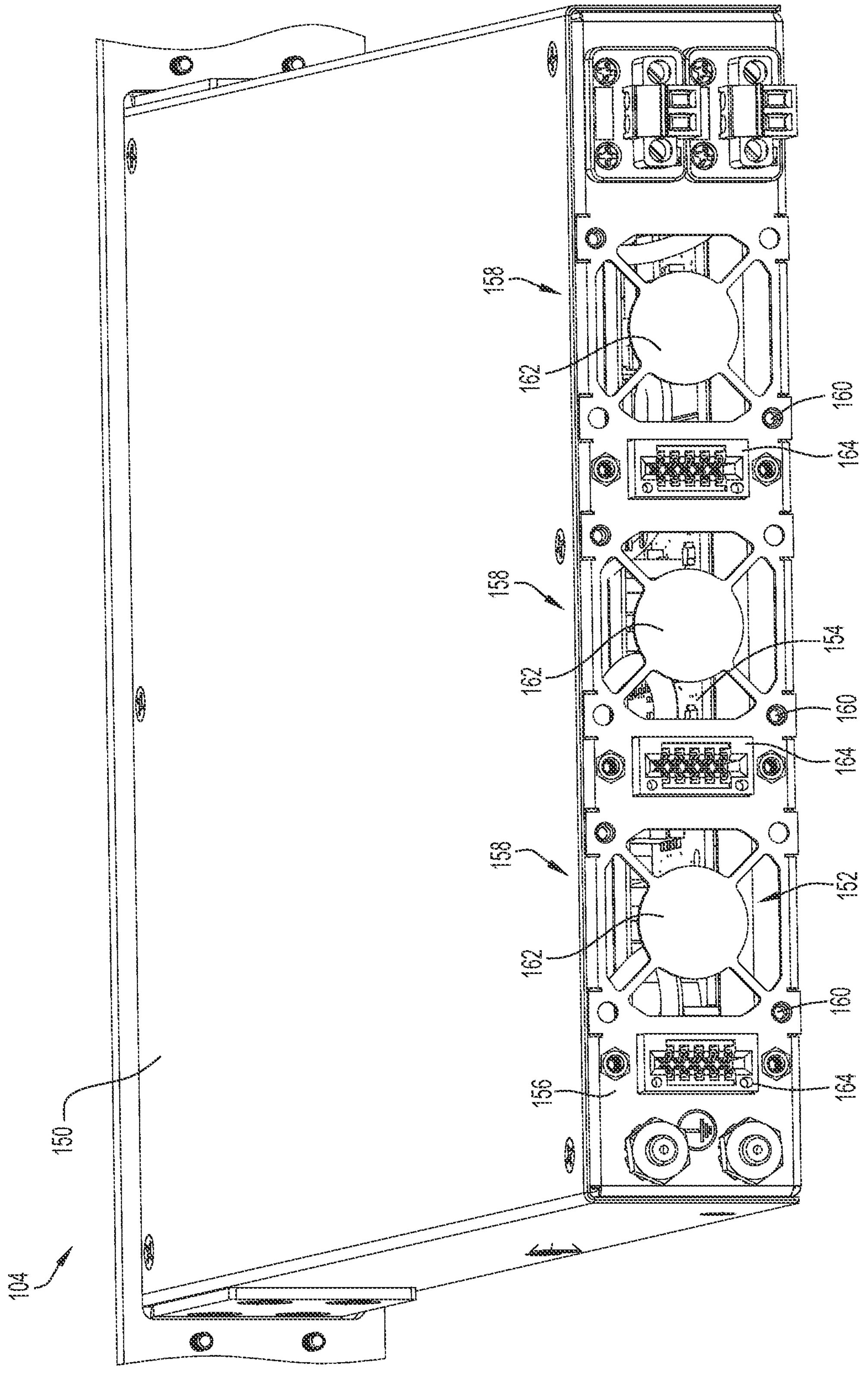
FIG. 2 is a rear perspective view of an electrical device of FIG. 1 without the fan modules installed.

FIG. 2 is a perspective view of one of the electrical devices 104. The fan modules 106 are not shown for better visualization of the electrical device 104. The electrical device 104 may include an enclosure 150 defining an interior 152 in which various electrical components 154 (e.g., a printed circuit board (PCB), electrical conductors, power components) may be positioned. Thus, the enclosure 150 may shield the electrical components 154 from external elements, such as dust and/or debris.

A plate 156 of the enclosure 150 may be configured to interact with the fan modules. By way of example, the plate 156 may have an external surface facing away from the interior 152 and having openings 158 that each expose the interior 152 of the enclosure 150 to an external environment. Thus, a fan module 106 may be configured to direct air through the interior 152 via one of the openings 158, such as by discharging air from the interior 152 to the external environment and/or by introducing air into the interior 152 from the external environment. Additionally, the plate 156 may include respective holes 160 surrounding the openings 158. The holes 160 may be used for coupling the fan modules 106 to the plate 156, such as via fasteners, and aligning the fan modules 106 with the openings 158 to enable the fan modules 106 to direct air through the enclosure 150. Moreover, the plate 156 may include a respective cover 162 positioned within each opening 158 to block extension of the fan modules 106 into the interior 152. For example, each cover 162 may abut a fan module 106 to impede the fan module 106 from extending into the enclosure 150, thereby reducing an amount of space occupied by the fan modules 106 in the interior 152 of the enclosure 150.

Furthermore, the plate 156 may include electrical interfaces 164 that are each configured to engage with a respective control board of the fan modules 106. By way of example, the electrical interfaces 164 are communicatively coupled to a power component and/or a control component of the electrical components 154 disposed within the interior 152 of the enclosure 150. The power component may be configured to provide power to enable operation of the fan modules 106, and the control component may be configured to transmit signals for controlling operation of the fan modules 106, such as to initiate operation, suspend operation, and/or adjust an operation (e.g., a fan speed) of the fan modules 106. Thus, the fan modules 106 may readily operate upon coupling to the electrical interfaces 164, such as without having to perform additional modifications of the fan modules 106 and/or of the electrical device 104 (e.g., to route separate electrical conductors/connectors). As such, an case of implementation of the fan modules 106 may be improved.

Figure 3:
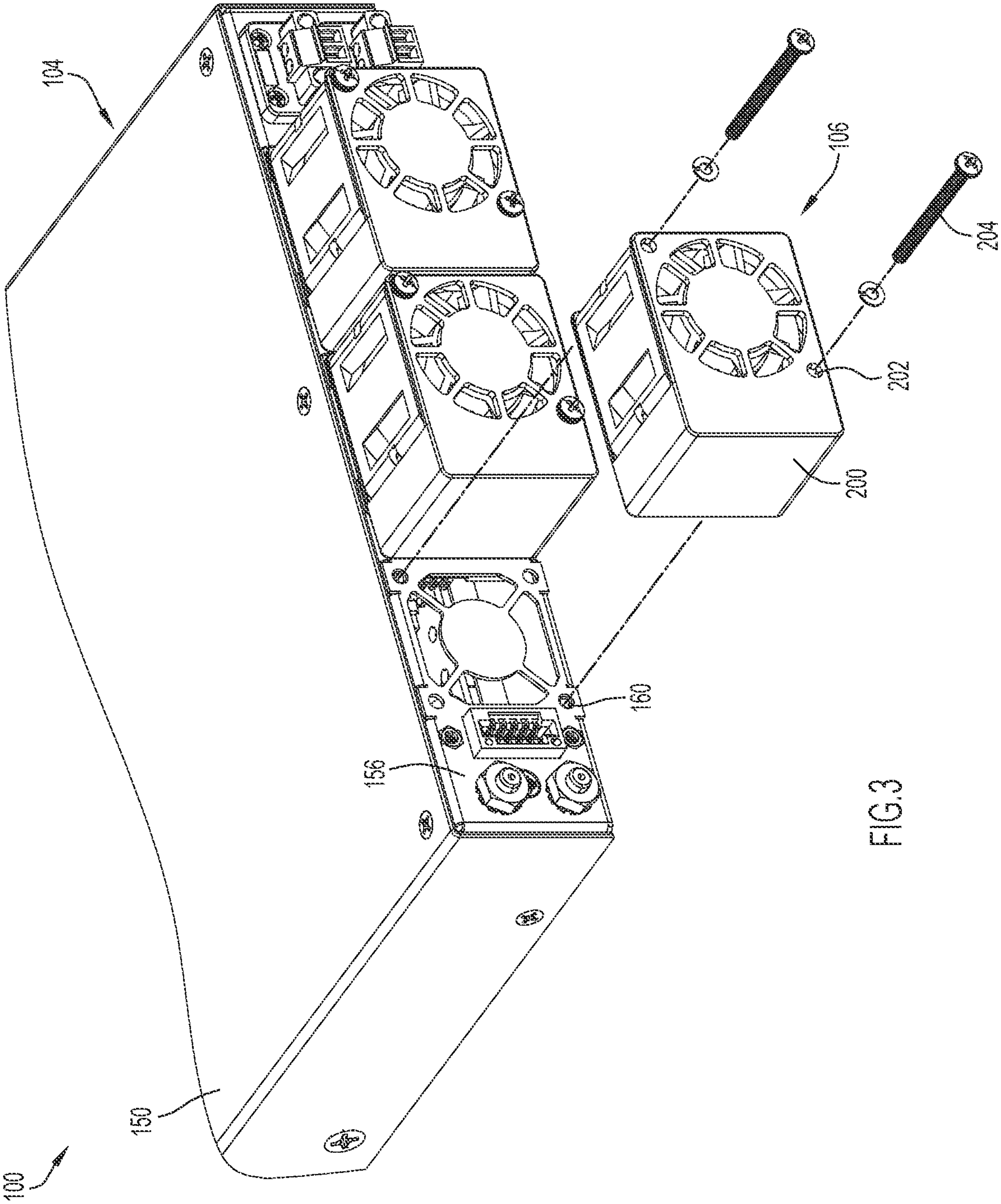
FIG. 3 is a partial exploded view of the electrical device and a fan module of FIG. 1, according to an example embodiment.

FIG. 3 is a partial exploded view of the system 100 depicting the coupling between the plate 156 and one of the fan modules 106. For instance, a housing 200 of the fan module 106 may include apertures 202, and fasteners 204 may be configured to extend through the apertures 202 and into the holes 160 of the plate 156 to compress the housing 200 against the plate 156, thereby mounting the fan module 106 to the electrical device 104. While the fan module 106 is coupled to the plate 156, the fasteners 204 may remain exposed and accessible to enable the fasteners 204 to be removed from the holes 160 and the apertures 202, thereby enabling the fan module 106 to be decoupled from the plate 156. In this manner, the fasteners 204 may enable the fan module 106 to be removably coupled to the enclosure 150 in which the fan module 106 can be readily coupled to and decoupled from the electrical device 104 via adjustment of the fasteners 204.

Figure 4:
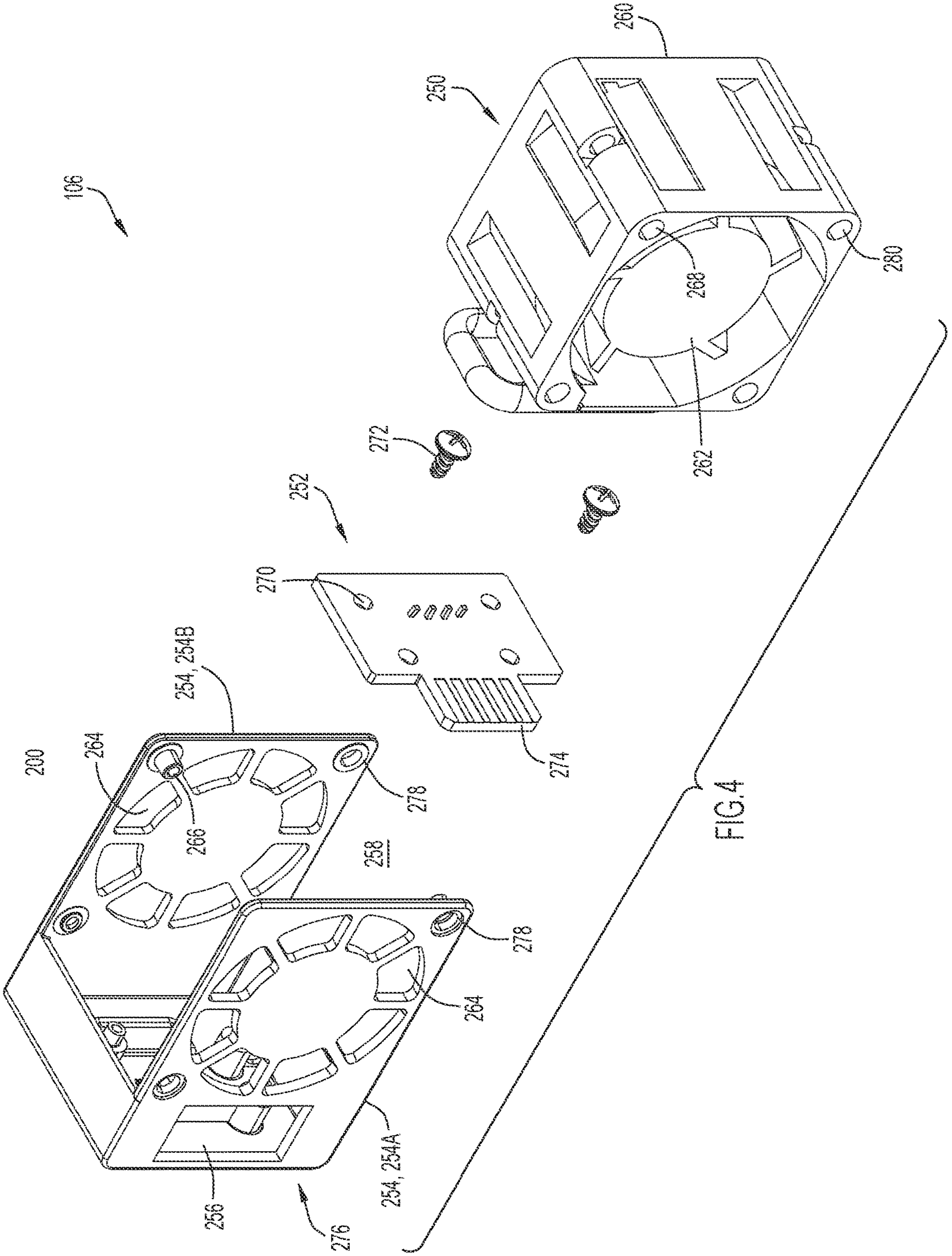
FIG. 4 is an exploded view of a fan module configured to couple to an electrical device, according to an example embodiment.

FIG. 4 is an exploded view of one of the fan modules 106. In certain embodiments, the depicted fan module 106 is representative of each fan module 106 configured to couple to the electrical devices 104. That is, each fan modules 106 implemented for cooling of the electrical devices 104 may be of a common embodiment. Thus, different embodiments of fan modules 106, each dedicated for a particular implementation (e.g., coupling to one of the electrical devices 104), may be avoided. For instance, the same embodiment of fan modules 106 may be used to replace one another without having to manufacture and/or purchase other embodiments of fan modules 106. Thus, an case of assembling and/or modifying the system 100 using the fan modules 106 may be facilitated.

The fan module 106 may be modular and include a separate housing 200, fan 250, and control board 252 configured to couple to one another. In the illustrated embodiment, each of the housing 200 and the fan 250 has a rectangular prismatic shape. However, it should be noted that the housing 200 and/or the fan 250 may have any other suitable shape, such as a spherical shape, a pyramidal shape, a hexagonal shape, and the like, in alternative embodiments. The housing 200 may include a first panel 254A (e.g., a front panel), a second panel 254B (e.g., a back panel), and a wall 256 extending between the first panel 254A and the second panel 254B to couple the panels 254 to one another. That is, the wall 256 may extend transverse to each of the panels 254 to offset the panels 254 from one another. As such, the panels 254 and the wall 256 cooperatively define a space 258 extending between the panels 254.

The fan 250 may include a fan enclosure 260 and blades 262 disposed within the fan enclosure 260. During operation of the fan module 106, the blades 262 may be configured to rotate within the fan enclosure 260 to direct an airflow. The fan enclosure 260 may be positioned within the space 258 and coupled to the panels 254. Coupling the fan enclosure 260 to the panels 254 may align the blades 262 with fan openings 264 formed through the panels 254. Thus, the airflow directed by the blades 262 may flow through the fan openings 264. As an example, each of the panels 254 may include a pin 266 extending into the space 258, and the fan enclosure 260 may include first apertures 268 configured to receive the pins 266. The extension of the pins 266 within one of the first apertures 268 may restrict movement of the fan enclosure 260 relative to the panels 254, thereby coupling the fan 250 to the housing 200.

The control board 252 (e.g., various electrical fan control components mounted on a PCB) may be configured to couple to the wall 256. For instance, the control board 252 may include apertures 270 that are each configured to receive a fastener 272 for mounting the control board 252 against the wall 256. The control board 252 may be configured to communicatively couple to the fan 250 to control operation of the fan 250. For example, the control board 252 may propagate signals that help initiate, adjust, and/or suspend rotation (e.g., a rotational speed) of the blades 262, thereby adjusting a rate of the airflow directed by the blades 262. Additionally, the control board 252 may include an electrical connector 274 (e.g., an edge connector) configured to couple to one of the electrical interfaces 164 of the electrical device 104, thereby communicatively coupling the electrical device 104 and the fan module 106 to one another. To this end, the first panel 254A may include a cutout 276, and coupling the control board 252 to the wall 256 may extend the electrical connector 274 through the cutout 276. As a result, the electrical connector 274 may extend outside of the space 258 and may be exposed to enable connection to the electrical interface 164. It should be noted that although the illustrated fan module includes the cutout 276 formed through the first panel 254A, in additional or alternative embodiments, the cutout 276 may be formed through the second panel 254B. For example, each of the panels 254 may include the cutout 276 to provide greater flexibility of assembling the fan module 106, such as to enable the control board 252 to be oriented to extend the electrical connector 274 through either of the panels 254.

In some embodiments, the same fasteners 204 may be configured to extend through each of the panels 254, the fan 250, and the plate 156 of the electrical device 104 to couple the housing 200, the fan 250, and the electrical device 104 to one another. By way of example, each of the panels 254 may include apertures 278, which are configured to align with corresponding second apertures 280 formed through the fan enclosure 260. Thus, the fasteners 204 may be inserted through the aligned apertures 278, 280 to secure the fan enclosure 260 to the fasteners 204. While the fasteners 204 are inserted through the panels 254 and the fan 250, a portion of each fastener 204 may remain exposed to enable the fasteners 204 to be inserted into the holes 160 of the plate 156 to secure the fan module 106 to the electrical device 104. Coupling the fan modules 106 to the electrical device 104 may also align the fan openings 264 with one of the openings 158 of the electrical device 104, thereby enabling the blades 262 to direct air through the aligned openings 158, 264 (e.g., via rotation of the blades 262) and through the interior 152 of the enclosure 150.

Figure 5:
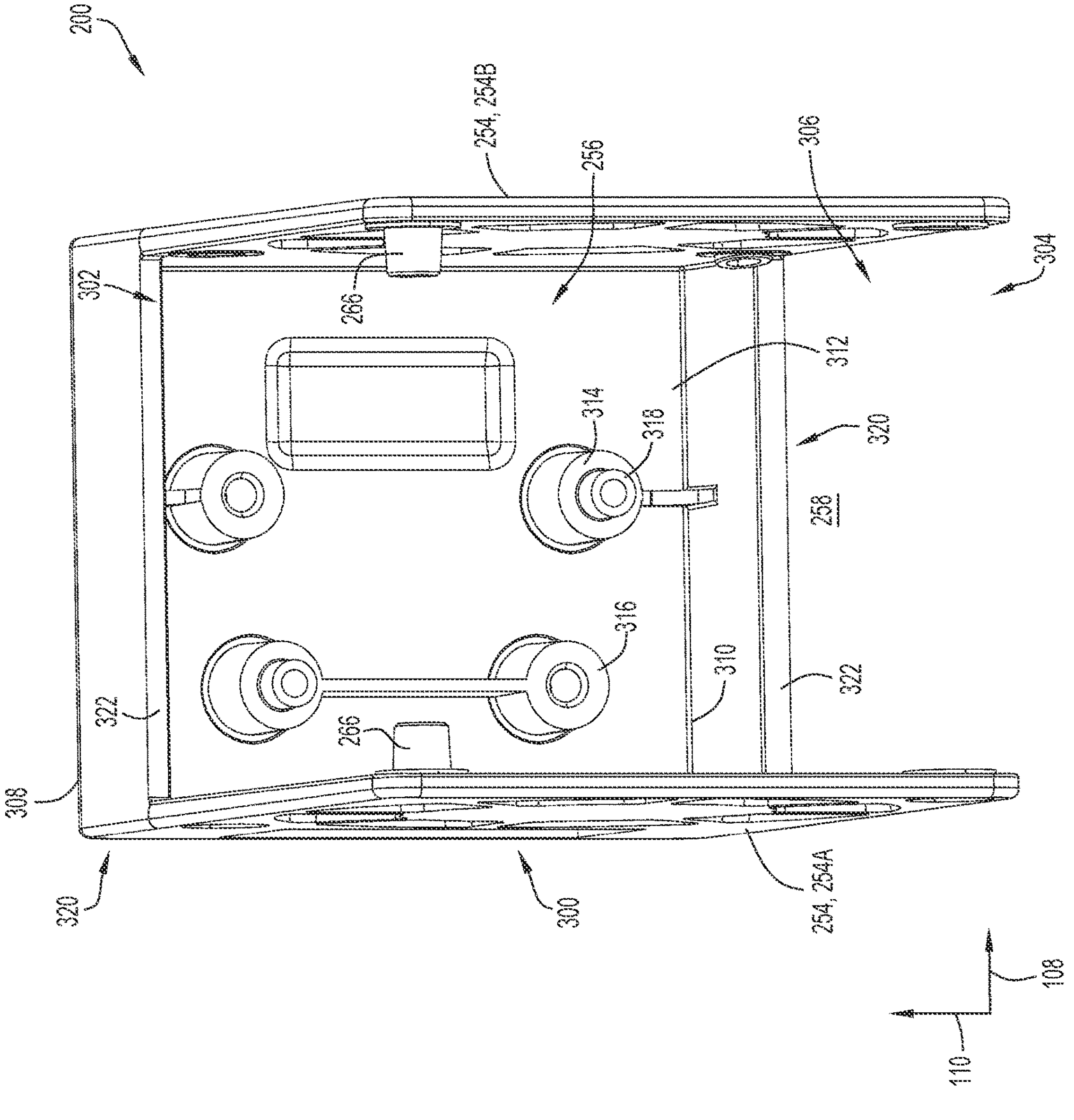
FIG. 5 is a perspective view of a housing of the fan module of FIG. 4.

FIG. 5 is a perspective view of the housing 200. Each panel 254 of the illustrated housing 200 may include a rectangular shape, and the wall 256 may extend along a first side 300 of the panels 254. However, a second side 302 (e.g., extending transverse to the first side 300), a third side 304 (e.g., opposite the second side 302), and a fourth side 306 (e.g., opposite the first side 300) of the panels 254 may remain open. That is, the space 258 is exposed at the second side 302, the third side 304, and the fourth side 306. Accordingly, the space 258 extends through the second side 302, the third side 304, and the fourth side 306 between the panels 254. Indeed, a first end 308 of the wall 256 may extend to the second side 302 of the panels 254 and a second end 310 of the wall 256 may extend to the third side 304 of the panels 254. As such, the space 258 may extend along the wall 256 and the panels 254 from the first end 308 of the wall 256 to the second end 310 of the wall 256 in between the panels 254. The increased exposure of the space 258 may facilitate positioning of the fan 250 therein. For instance, the fan 250 may be inserted into the space 258 from any of the sides 302, 304, 306. Consequently, the fan module 106 may be more easily assembled. Moreover, increasing exposure of the space 258 may reduce an amount of the housing 200 extending over the fan 250 to enable greater occupation of the space 258 by the fan 250. For example, aside from the wall 256 and the panels 254, the housing 200 may not exceed the dimensions of the fan 250. As a result, the fan 250 may better (e.g., more fully) occupy the space 258, and/or a size of the fan 250 may be increased (e.g., to reach or extend beyond the ends 308, 310 of the wall 256) without the fan module 106 extending beyond the electrical device 104 along the second axis 110. Thus, the size of the fan 250 may be sufficiently large to deliver adequate airflow to provide cooling of the electrical device 104 to increase the operational efficiency of the fan module 106 relative to a size of the fan module 106, while being sufficiently small to enable the fan module 106 to occupy a desirable footprint with respect to the electrical device 104. In additional or alternative embodiments, the panels 254 may have a different shape (e.g., and include a different quantity and/or orientation of sides), and the wall 256 may extend along a portion of the perimeter or outer boundary of the panels 254 to couple the panels 254 to one another while exposing the space 258 along a majority of the perimeter or outer boundary of the panels 254 to facilitate case of assembly of the fan modules 106. In any case, coupling the fan 250 with the housing 200 may align the blades 262 of the fan 250 with the fan openings 264 formed through the panels 254, thereby enabling the blades 262 to direct air through the fan openings 264.

The pins 266 used to secure the panels 254 to the fan 250 are positioned adjacent to the second side 302 and the fourth side 306 of the panels 254 in the illustrated embodiment. However, it should be noted that the pins 266 may be positioned in different locations in alternative embodiments, such as adjacent to the third side 304 of the panels 254. In addition, the respective pins 266 of the different panels 254 may be positioned at different locations, rather than aligned opposite to one another. In certain embodiments, each pin 266 may include an aperture to enable extension of a fastener therein for securing the housing 200 to the fan 250. In such embodiments, a single aperture of the fan 250 may be configured to receive one of the pins 266 and also one of the fasteners 204. Regardless, in each embodiment, the pins 266 may extend into the first apertures 268 of the fan 250 to secure the fan 250 within the space 258 (e.g., prior to extension of the fasteners 204 through the housing 200 and the fan 250) and block movement of the fan 250 out of the space 258, such as via the second side 302, the third side 304, and/or the fourth side 306 of the panels 254.

The wall 256 may include features extending from an inner surface 312 of the wall 256 for coupling the wall 256 to the control board 252. For instance, mounts 314 may extend from the inner surface 312 into the space 258. The mounts 314 may be configured to abut the control board 252, and each mount 314 may have an aperture 316 configured to receive one of the fasteners 272 to secure the control board 252 to the mount 314, though additional or alternative features, such as a pin and/or a latch, may be used to couple the control board 252 to the wall 256. Additionally, some of the mounts 314 may include an extension 318 that protrudes further into the space 258. For example, the extension 318 may be configured to extend into one of the apertures 270 of the control board 252 to help position the control board 252 with respect to the mounts 314 to align the apertures 270 of the control board 252 with the apertures 316 of the mounts 314. As such, the extension 318 may further facilitate an case of assembly of the fan module 106. Moreover, in certain embodiments, the mounts 314 may be arranged to enable a portion of the control board 252 to be positioned between the mounts 314 to help position the control board 252 to abut the mounts 314.

The housing 200 may further include cover portions 320 that extend from the wall 256 and transverse to the inner surface 312. As an example, one of the cover portions 320 may extend from the first end 308 of the wall 256 and along the second side 302 of the panels 254, and another of the cover portions 320 may extend from the second end 310 of the wall 256 and along the third side 304 of the panels 254. The cover portions 320 may help shield the control board 252 coupled to the wall 256. For instance, the cover portions 320 may extend over and beyond the mounts 314. Therefore, the cover portions 320 may also extend over and beyond the control board 252 abutting the mounts 314. As such, the cover portions 320 may help shield the control board 252 from external elements, such as dust and debris. Indeed, in certain embodiments, the fan enclosure 260 of the fan 250 may be configured to abut edges 322 of the cover portions 320 such that the fan enclosure 260, the panels 254, the inner surface 312 of the wall 256, and the cover portions 320 cooperatively surround the control board 252 to form a compartment within which the control board 252 may be positioned to shield the control board 252 from external elements. Therefore, such a configuration may increase a structural integrity of the control board 252 to maintain desirable operation and/or prolong a useful lifespan of the control board 252.

Figure 6:
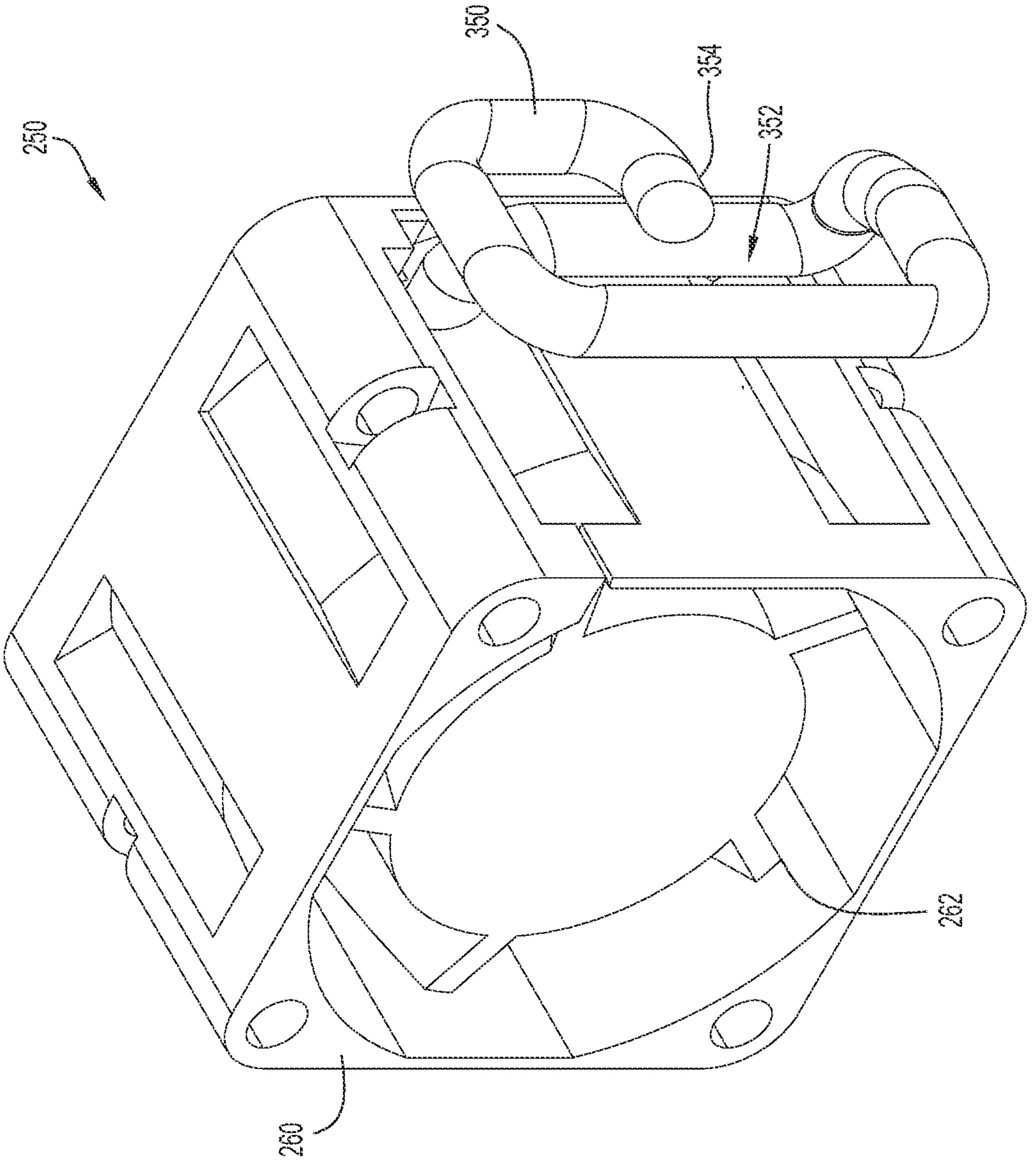
FIG. 6 is a perspective view of a fan of the fan module of FIG. 4.

FIG. 6 is a perspective view of the fan 250. The illustrated fan 250 includes an electrical conductor 350 (e.g., representative of a cable or a bundle of wires) electrically coupled to the blades 262 and extending from the fan enclosure 260. By way of example, the electrical conductor 350 may form a helical, spiral, or coiled shape to define a space 352 configured to receive a portion of the control board 252. Additionally, an end 354 of the electrical conductor 350 may terminate adjacent to the space 352 to be able to electrically couple to the control board 252. As a result, the control board 252 may transmit signals (e.g., provided by the electrical components 154) via the electrical conductor 350 to operate the blades 262 (e.g., to control rotation of the blades 262).

Figure 7:
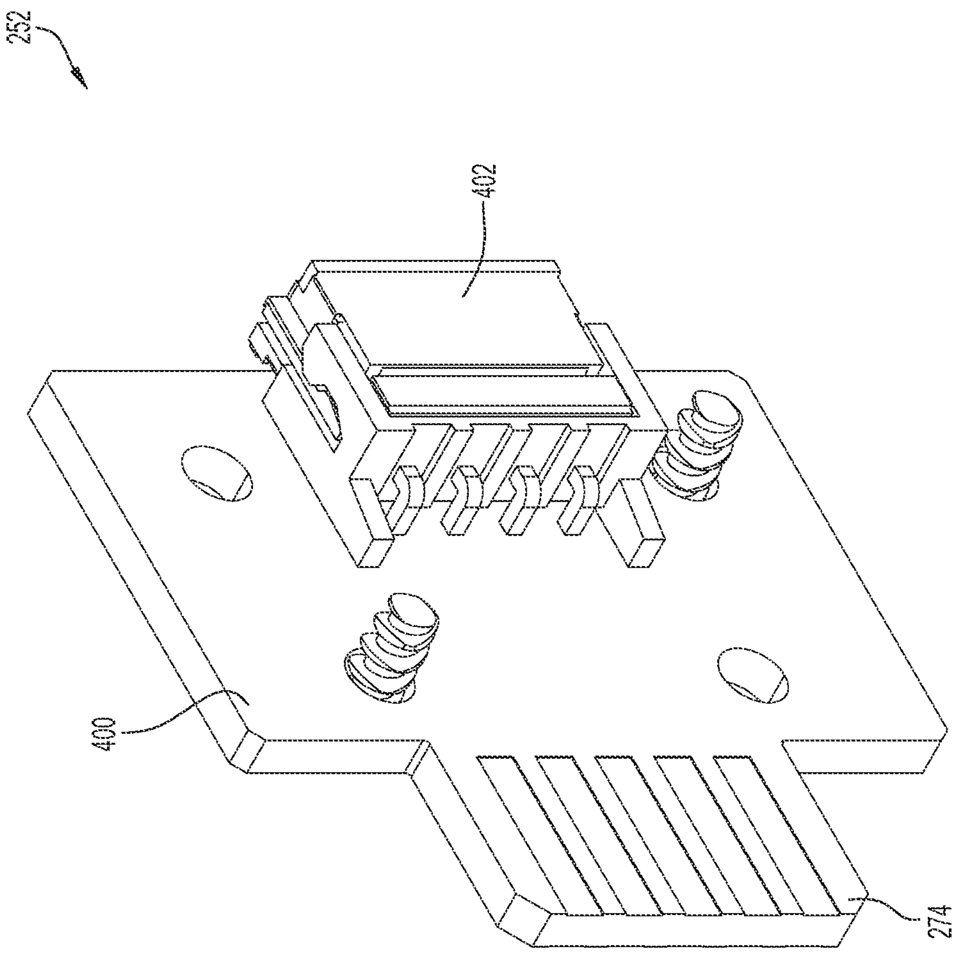
FIG. 7 is a perspective view of a control board of the fan module of FIG. 4.

FIG. 7 is a perspective view of the control board 252. The control board 252 may include a board substrate 400 and an interface 402. The electrical connector 274 may extend from the board substrate 400. Thus, the board substrate 400 may electrically couple to the electrical components 154 of the electrical device 104 via the electrical connector 274. That is, the electrical connector 274 may transmit signals between the interface 402 and the electrical components 154. Furthermore, the electrical conductor 350 of the fan 250 may be configured to couple to the interface 402 (e.g., via a crimping technique, via a solder) to electrically couple to the board substrate 400. Therefore, the control board 252 may readily and reliably enable the fan 250 and the electrical components 154 of the electrical device 104 to communicate with one another via the interface 402 and the electrical connector 274 (e.g., without usage of a separate, dedicated component for electrically coupling the control board 252 to the fan 250 and/or to the electrical components 154), thereby enabling the electrical components 154 to control operation of the fan 250.

In additional or alternative embodiments, the control board 252 may be configured to perform other operations. To this end, the board substrate 400 may be configured to couple to an integrated circuit (IC), such as an application-specific integrated circuit (ASIC), and/or the control board 252 may include memory (e.g., non-volatile memory, such as electrically erasable programmable read-only memory, volatile memory, such as random access memory). In such embodiments, the control board 252 may be configured to generate and transmit signals for controlling operation of the fan 250 (e.g., to initiate, suspend, and/or adjust operation of the fan 250). Additionally or alternatively, the control board 252 may be configured to store information (e.g., for display and/or transmission, such as to a user device), such as operating parameters/characteristics regarding the fan module 106 and/or the electrical device 104, manufacturing information, and the like.

Figure 8:
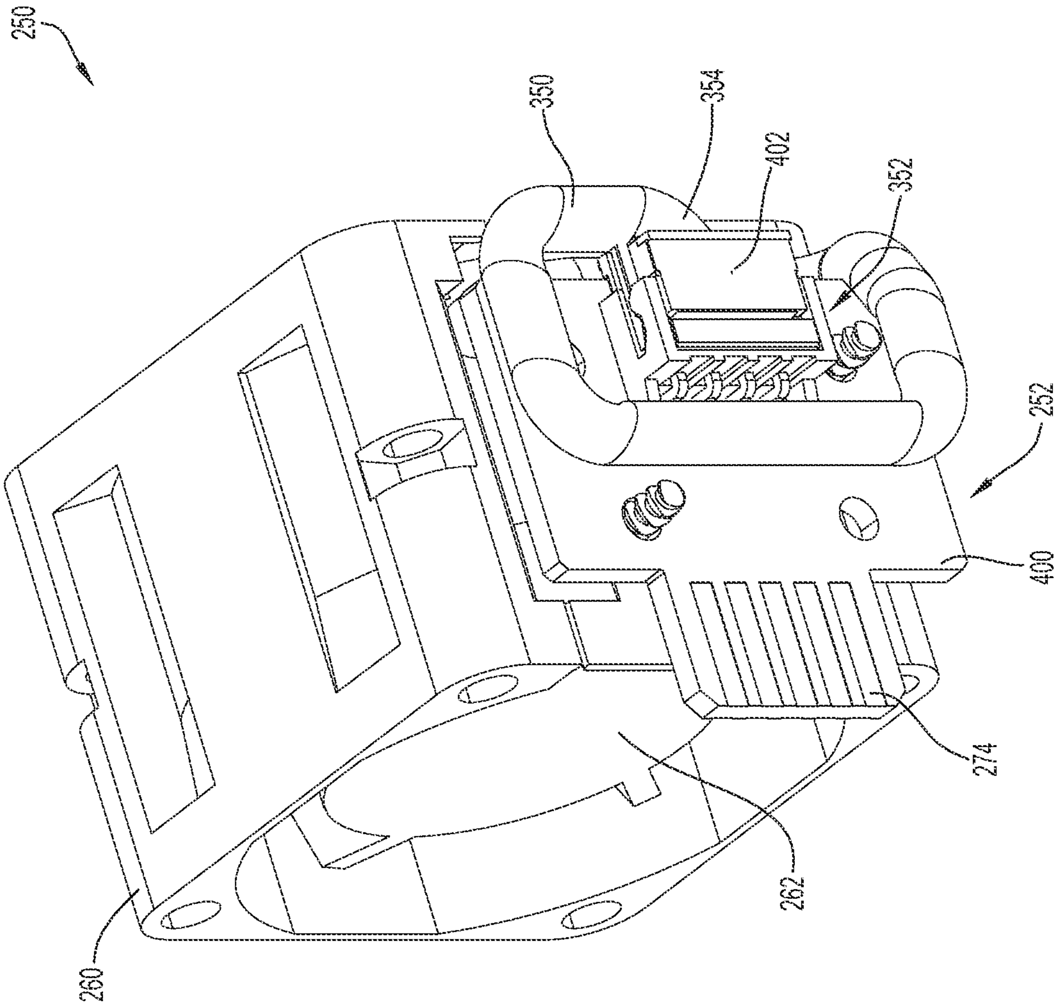
FIG. 8 is a perspective view of the fan of FIG. 6 coupled to the control board of FIG. 7.

FIG. 8 is a perspective view of the fan 250 and the control board 252 coupled to one another. By way of example, the interface 402 of the control board 252 may be positioned within the space 352 defined by the electrical conductor 350 and coupled to the end 354 of the electrical conductor 350, thereby electrically coupling the control board 252 and the fan 250 to one another to enable the control board 252 to operate the fan 250 (e.g., to rotate the blades 262). While the control board 252 is coupled to the fan 250, the electrical connector 274 of the control board 252 may extend beyond the fan enclosure 260 to enable the electrical connector 274 to extend through the cutout 276 of the first panel 254A for coupling to one of the electrical interfaces 164 of the electrical device 104.

Figure 9:
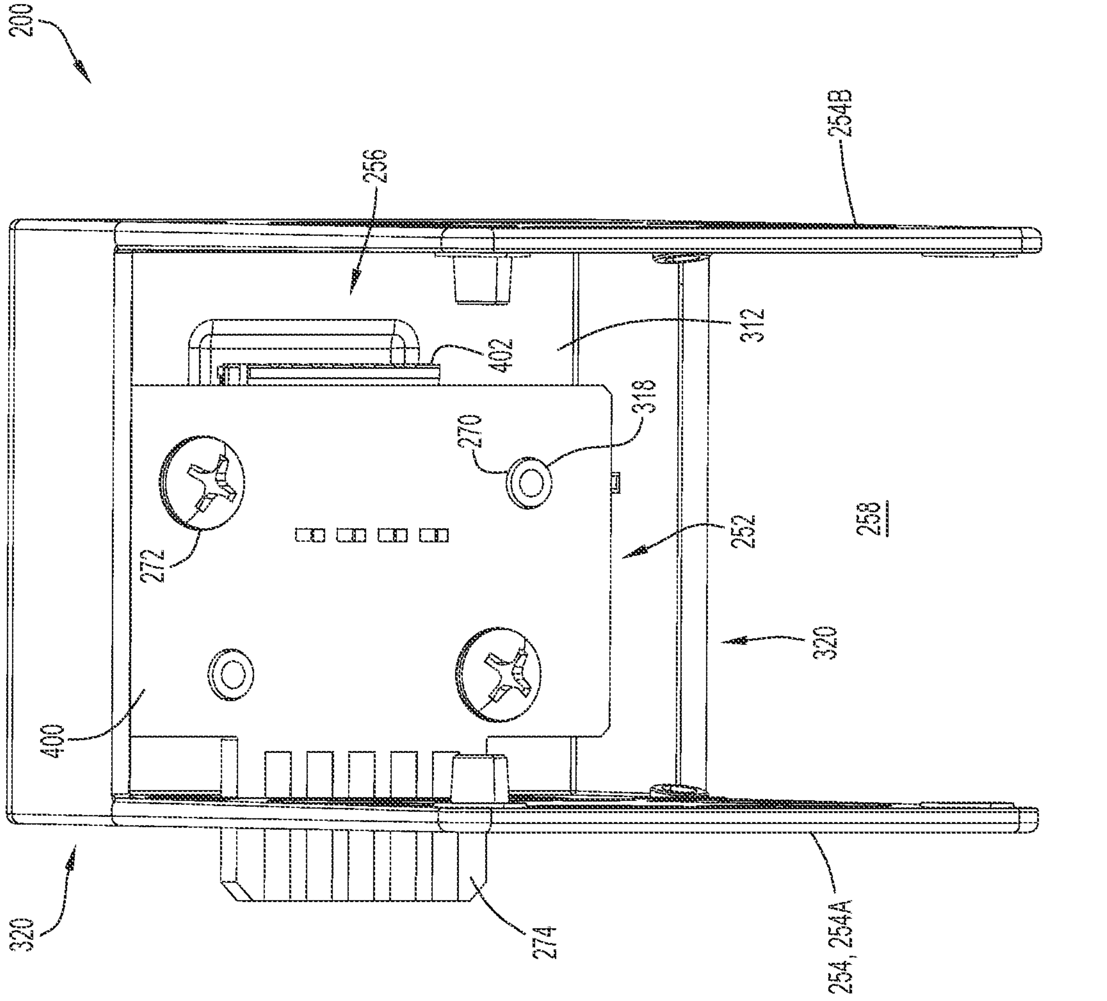
FIG. 9 is a perspective view of the control board of FIG. 7 coupled to the housing of FIG. 4.

FIG. 9 is a perspective view of the control board 252 coupled to the housing 200 within the space 258 between the panels 254. For example, the board substrate 400 may be engaged with the mounts 314 such that the control board 252 is positioned between the panels 254, the cover portions 320, and the inner surface 312 of the wall 256. To this end, the extensions 318 of the mounts 314 may extend through corresponding apertures 270 formed through the board substrate 400, and the fasteners 272 may extend through other apertures 270 formed through the board substrate 400. In addition, the electrical connector 274 may extend through the first panel 254A and out of the space 258 to enable the electrical connector 274 to couple to one of the electrical interfaces 164 of the electrical device 104. In the illustrated embodiment, the interface 402 is positioned between the board substrate 400 and the inner surface 312 of the wall 256, such as between the mounts 314. As such, the board substrate 400 and the inner surface 312 may further shield the interface 402 to maintain a structural integrity and operation of the interface 402. The electrical conductor 350 of the fan 250 may extend (e.g., in a coiled, helical, or spiral manner) around the board substrate 400 and between the board substrate 400 and the inner surface 312 to couple to the interface 402.

Figure 10:
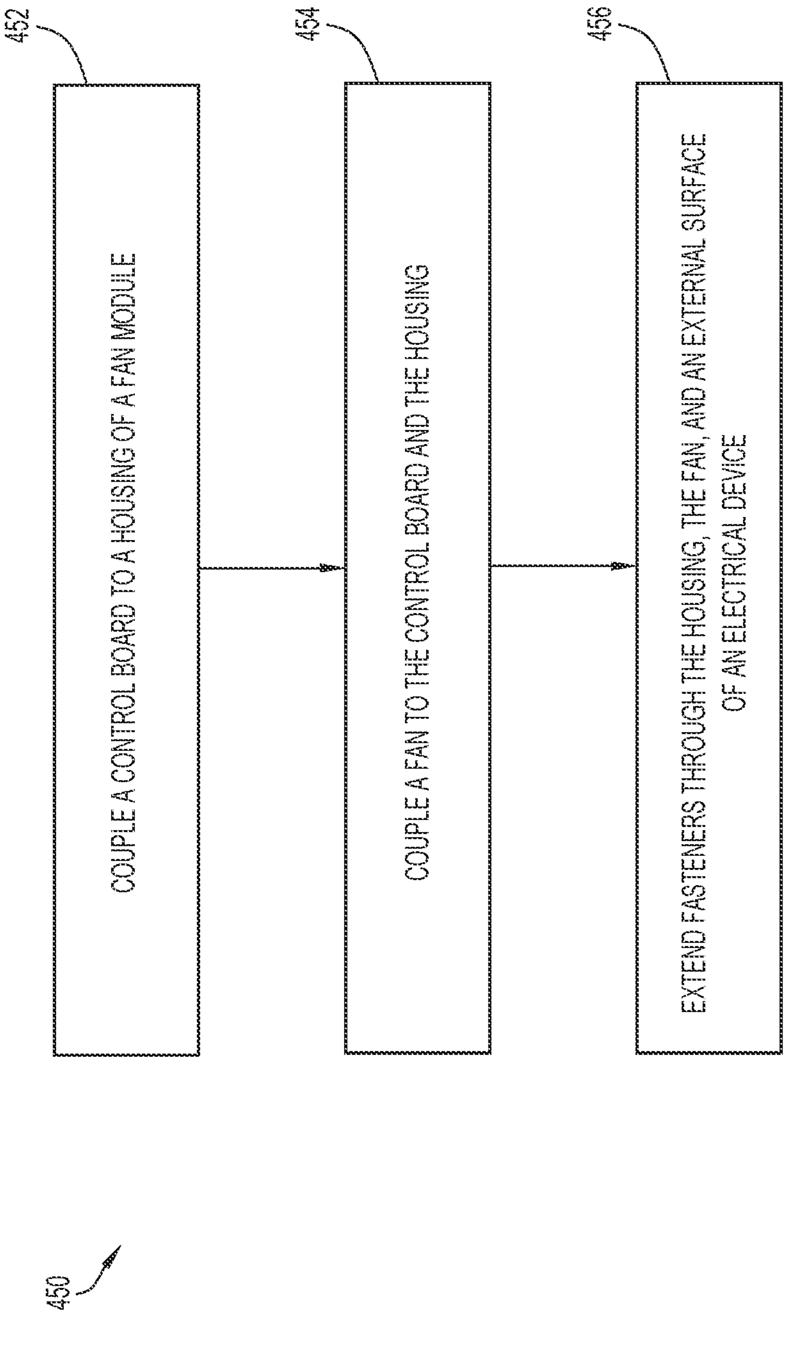
FIG. 10 is a flowchart of a method of manufacturing a fan module, according to an example embodiment.

FIG. 10 is a flowchart of a method 450 of manufacturing a fan module (e.g., the fan module 106). The operations of the method 450 may be performed by a single entity or by multiple entities, and at least a portion of the method 450 may be performed automatically (e.g., by a control system). It should be noted that the method 450 may be performed differently than depicted. For example, an additional operation may be performed, and/or any of the depicted operations may be performed differently, performed in a different order, and/or not performed.

At step 452, a control board may be coupled to a housing of the fan module. For example, the housing may include panels that are offset from one another to define a space therebetween, as well as a wall that couples the panels to one another. The wall may include mounts extending from an inner surface into the space, and the control board may be positioned within the space and coupled to the mounts. For instance, the control board may include a board substrate with apertures. In some embodiments, the mounts may include extensions configured to extend into the apertures of the board substrate to couple the control board to the mounts. Additionally or alternatively, the mounts may include apertures, and fasteners may be inserted through the apertures of the mounts and the apertures of the board substrate to couple the control board to the mounts. In either case, the board substrate may include an electrical connector of the board substrate that extends through a cutout formed through one of the panels to extend outside of the space between the panels, thereby exposing the electrical connector.

In certain embodiments, the control board may include an interface coupled to the board substrate and positioned between the inner surface of the wall and the board substrate (e.g., between the mounts of the housing) while the control board is coupled to the housing. Moreover, the housing may include cover portions that extend over the control board coupled to the mounts. As such, the housing may sufficiently shield and protect the control board from external elements.

At step 454, a fan may be coupled to the control board and the housing. As an example, the fan may include a fan enclosure, blades configured to rotate within the fan enclosure, and an electrical conductor electrically coupled to the blades and extending from the fan enclosure. The fan enclosure may be configured to couple to the housing. For instance, the fan enclosure may include apertures formed therethrough, and each panel of the housing may include a pin configured to extend into one of the apertures to couple the fan enclosure to the panels. Coupling the fan enclosure to the panels may align the blades of the fan with openings formed through the panels of the housing. Consequently, rotation of the blades may direct air through the panels. The fan enclosure may be configured to abut edges of the cover portions of the housing such that the wall, the panels, the cover portions, and the fan enclosure cooperatively cover and shield the control board. Additionally, the electrical conductor of the fan may be configured to electrically couple to the interface of the control board, thereby electrically coupling the interface and the blades to one another. In certain embodiments, the electrical conductor of the fan may be routed to define a space, and the interface of the control board may be positioned within the space to electrically couple to the electrical conductor of the fan. In any case, coupling the fan to the control board and the housing may provide an assembled fan module.

At step 456, fasteners may be extended through the housing, the fan, and an external surface of an electrical device to couple the housing, the fan, and the electrical device to one another. By way of example, the apertures of the fan enclosure may be configured to align with corresponding apertures formed through the panels, and the fasteners may be configured to extend through the aligned apertures. Moreover, the apertures of the fan enclosure and of the panels may be configured to align with holes formed through the external surface of the electrical device, and the fasteners may also be configured to extend through the holes. As such, each fastener may help secure the housing, the fan, and the electrical device to one another. For this reason, usage of an excessive quantity of components, such as fasteners dedicated to securing the housing and the fan to one another and separate fasteners dedicated to securing the fan module and the electrical device to one another, may be avoided. Coupling the fan module to the electrical device may align the blades and the openings formed through the panels with an opening formed through the external surface of the electrical device. Therefore, the blades may direct air through the opening of the panels and through the opening of the electrical device to cool an interior of the electrical device (e.g., electrical components located within the interior of the electrical device).

Further, coupling the fan module to the electrical device may engage the electrical connector of the control board with an electrical interface of the electrical device, thereby electrically coupling the interface of the control board to an electrical component of the electrical device. For example, the electrical component may transmit signals to the control board via the electrical connector, and the control board may propagate the signals to the fan via the interface to cause the fan to operate based on the signals. It should be noted that the control board may be readily electrically coupled to the electrical component of the electrical device by coupling the fan module to the electrical device via the fasteners. In other words, the fan module may be secured to and electrically coupled to the electrical device without having to perform a separate operation dedicated to performing one of electrically coupling the control board of the fan module to the electrical device or securing the housing of the fan module to the external surface. For this reason, an case of coupling the fan module and the electrical device to one another may be improved.

A similar method may also be performed to decouple the fan module and the electrical device from one another. For example, the fasteners may be removed from the housing, the fan, and the external surface of the electrical device to decouple the fan module and the electrical device. Moreover, the electrical conductor of the fan may be decoupled from the interface of the control board to decouple the fan from the control board, and the pins of the panels of the housing may be removed from the apertures of the fan enclosure of the fan to decouple the fan from the housing. Further still, fasteners may be removed from the board substrate of the control board and from the mounts of the housing to decouple the control board from the housing. Thus, the fan module may be readily detached from the electrical device and/or the fan module may be readily disassembled, such as for inspection, repair, and/or replacement of the fan module. Indeed, the fan module may be detached and modified without having to adjust an operation of or further modify the electrical device, thereby enabling continued operation of the electrical device to increase its operational efficiency.

In some aspects, the techniques described herein relate to an apparatus including: a first panel; a second panel offset from the first panel to define a space therebetween; a wall extending from the first panel to the second panel, such that the space extends along the wall, the first panel, and the second panel from a first end of the wall to a second end, opposite the first end, of the wall; and a fan configured to be disposed in the space between the first panel and the second panel.

In some aspects, the techniques described herein relate to an apparatus, wherein the space extends between the first panel and the second panel through a first side of the first panel and of the second panel and through a second side, opposite the first side, of the first panel and of the second panel.

In some aspects, the techniques described herein relate to an apparatus, further including a control board configured to couple to the wall and control operation of the fan.

In some aspects, the techniques described herein relate to an apparatus, wherein the wall includes a mount extending from an inner surface of the wall into the space, and the control board includes a board substrate configured to engage with the mount to couple the control board to the wall.

In some aspects, the techniques described herein relate to an apparatus, wherein the mount includes an extension extending further into the space, and the board substrate includes an aperture configured to receive the extension to engage the board substrate with the mount.

In some aspects, the techniques described herein relate to an apparatus, wherein the mount includes an aperture, the board substrate includes an additional aperture configured to align with the aperture of the mount, and the apparatus includes a fastener configured to extend into the aperture of the mount and the additional aperture of the board substrate of the control board to engage the board substrate with the mount.

In some aspects, the techniques described herein relate to an apparatus, wherein the fan includes an electrical conductor configured to couple to the control board, and the control board is configured to transmit a signal to operate the fan via the electrical conductor.

In some aspects, the techniques described herein relate to an apparatus, wherein the electrical conductor is coiled to define an additional space, and the control board includes an interface configured to be positioned in the space to couple to the electrical conductor.

In some aspects, the techniques described herein relate to a system including: an electrical device including an enclosure, wherein the enclosure defines an interior, and the enclosure includes an external surface facing away from the interior; and a fan module including: a housing defining a space; a fan positioned in the space of the housing and configured to direct air through the enclosure of the electrical device; and a fastener configured to extend through the housing, the fan, and the external surface of the enclosure to mount the fan module onto the electrical device.

In some aspects, the techniques described herein relate to a system, wherein the external surface includes an electrical interface electrically coupled to an electrical component positioned within the interior of the enclosure, and the fan module includes a control board positioned in the space of the housing and configured to engage with the electrical interface to electrically couple to the electrical component.

In some aspects, the techniques described herein relate to a system, wherein the housing includes a first panel and a second panel offset from one another to define the space, each of the first panel and the second panel includes an aperture, the fan includes an additional aperture, the external surface includes a hole, and the fastener is configured to extend through the aperture of the first panel and of the second panel, the additional aperture of the fan, and the hole of the external surface to extend through the housing, the fan, and the external surface of the enclosure.

In some aspects, the techniques described herein relate to a system, wherein the external surface includes an opening, the fan is configured to direct air through the enclosure via the opening, and the enclosure of the electrical device includes a cover positioned in the opening and configured to abut the housing of the fan module to block extension of the housing into the electrical device.

In some aspects, the techniques described herein relate to a system, wherein the fan includes a first aperture and a second aperture, the housing includes a pin configured to extend into the first aperture to couple the fan to the housing, and the fastener is configured to extend through the second aperture of the fan to mount the fan module onto the electrical device.

In some aspects, the techniques described herein relate to an apparatus including: a housing including a first panel and a second panel cooperatively defining a space therebetween, wherein the first panel includes a pin extending into the space; a fan configured to be positioned within the space of the housing, wherein the fan includes a first aperture and a second aperture, and the first aperture is configured to receive the pin of the first panel; and a fastener configured to extend through the second aperture of the fan to couple the fan and the housing to one another.

In some aspects, the techniques described herein relate to an apparatus, further including a control board configured to be positioned within the space of the housing and control operation of the fan.

In some aspects, the techniques described herein relate to an apparatus, wherein the housing includes a wall extending from the first panel to the second panel and a plurality of mounts extending from an inner surface of the wall into the space, the control board includes a board substrate and an interface coupled to the board substrate, the board substrate is configured to couple to the plurality of mounts, and the interface is configured to be positioned between the plurality of mounts and between the board substrate and the inner surface of the wall.

In some aspects, the techniques described herein relate to an apparatus, wherein the housing includes cover portions extending from the wall and over the control board.

In some aspects, the techniques described herein relate to an apparatus, wherein the fan is configured to abut a respective edge of the cover portions such that the first panel, the second panel, the inner surface of the wall, the cover portions, and the fan cooperatively surround the control board.

In some aspects, the techniques described herein relate to an apparatus, wherein the fan includes an electrical conductor configured to extend around the board substrate and between the wall and the board substrate to couple to the interface, and the control board is configured to control operation of the fan via the electrical conductor.

In some aspects, the techniques described herein relate to an apparatus, wherein the housing includes a wall coupling the first panel and the second panel to one another, the wall extends along a first side of the first panel and of the second panel, and the space extends through a second side, opposite the first side, of the first panel and of the second panel.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . or "step for [perform]ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:

a first panel comprising a surface;

a second panel offset from the first panel to define a space therebetween;

a wall extending from the first panel to the second panel, such that the space extends along the wall, the first panel, and the second panel from a first end of the wall to a second end, opposite the first end, of the wall;

a fan configured to be disposed in the space between the first panel and the second panel and against the surface of the first panel; and a control board configured to be disposed in the space, wherein the control board comprises a board substrate configured to couple to the wall and an electrical connector extending from the board substrate and configured to extend through a cutout of the surface of the first panel while the board substrate is coupled to the wall.

2. The apparatus of claim 1, wherein the space extends between the first panel and the second panel through a first side of the first panel and of the second panel and through a second side, opposite the first side, of the first panel and of the second panel.

3. The apparatus of claim 1, wherein the control board is configured to control operation of the fan.

4. The apparatus of claim 1, wherein the wall comprises a mount extending from an inner surface of the wall into the space, and the control board comprises a board substrate configured to engage with the mount to couple to the wall.

5. The apparatus of claim 4, wherein the mount comprises an extension extending further into the space, and the board substrate comprises an aperture configured to receive the extension to engage the board substrate with the mount.

6. The apparatus of claim 4, wherein the mount comprises an aperture, the board substrate comprises an additional aperture configured to align with the aperture of the mount, and the apparatus comprises a fastener configured to extend into the aperture of the mount and the additional aperture of the board substrate of the control board to engage the board substrate with the mount.

7. The apparatus of claim 3, wherein the fan comprises an electrical conductor configured to couple to the control board, and the control board is configured to transmit a signal to operate the fan via the electrical conductor.

8. The apparatus of claim 7, wherein the electrical conductor is coiled to define an additional space, and the control board comprises an interface configured to be positioned in the space to couple to the electrical conductor.

9. An apparatus comprising:

a housing comprising a first panel and a second panel offset along a first axis to cooperatively define a space therebetween, wherein the first panel comprises a pin extending into the space;

a fan configured to be positioned within the space of the housing, wherein the fan comprises a first aperture and a second aperture, and the first aperture is configured to receive the pin of the first panel;

a fastener configured to extend along the first axis and through the second aperture of the fan to couple the fan and the housing to one another; and a control board configured to be disposed in the space and adjacent to the fan along a second axis, transverse to the first axis.

10. The apparatus of claim 9, wherein the control board is configured to control operation of the fan.

11. The apparatus of claim 10, wherein the housing comprises a wall extending from the first panel to the second panel and a plurality of mounts extending from an inner surface of the wall into the space, the control board comprises a board substrate and an interface coupled to the board substrate, the board substrate is configured to couple to the plurality of mounts, and the interface is configured to be positioned between the plurality of mounts and between the board substrate and the inner surface of the wall.

12. The apparatus of claim 11, wherein the housing comprises cover portions extending from the wall and over the control board.

13. The apparatus of claim 12, wherein the fan is configured to abut a respective edge of the cover portions such that the first panel, the second panel, the inner surface of the wall, the cover portions, and the fan cooperatively surround the control board.

14. The apparatus of claim 11, wherein the fan comprises an electrical conductor configured to extend around the board substrate and between the wall and the board substrate to couple to the interface, and the control board is configured to control operation of the fan via the electrical conductor.

15. The apparatus of claim 9, wherein the housing comprises a wall coupling the first panel and the second panel to one another, the wall extends along a first side of the first panel and of the second panel, and the space extends through a second side, opposite the first side, of the first panel and of the second panel.

16. The apparatus of claim 1, further comprising a fastener configured to extend through the first panel, the second panel, and the fan.

17. The apparatus of claim 1, wherein the fan comprises an aperture, and the first panel comprises a pin configured to extend into the aperture to couple the fan to the first panel.

18. The apparatus of claim 4, wherein the control board comprises an electrical connector extending from the board substrate and configured to extend through the cutout of the surface of the first panel while the board substrate is coupled to the wall.

19. The apparatus of claim 9, wherein the fastener is configured to extend through the first panel and the first aperture of the fan to couple the fan to the housing.

20. The apparatus of claim 19, wherein the fastener is configured to extend through the first panel, the first aperture of the fan, and an electrical device to couple the apparatus to the electrical device.

* * * * *